(12) United States Patent
Kigawa et al.

(10) Patent No.: US 11,145,533 B2
(45) Date of Patent: Oct. 12, 2021

(54) EXPANDING METHOD

(71) Applicant: DISCO CORPORATION, Tokyo (JP)

(72) Inventors: Akiko Kigawa, Tokyo (JP); Shinichi Fujisawa, Tokyo (JP); Masayuki Matsubara, Tokyo (JP)

(73) Assignee: DISCO CORPORATION, Tokyo (JP)

(*) Notice: Subject to any disclaimer, the term of this patent is extended or adjusted under 35 U.S.C. 154(b) by 420 days.

(21) Appl. No.: 16/149,881

(22) Filed: Oct. 2, 2018

(65) Prior Publication Data
US 2019/0109035 A1 Apr. 11, 2019

(30) Foreign Application Priority Data

Oct. 6, 2017 (JP) .............................. JP2017-195915

(51) Int. Cl.
*H01L 21/683* (2006.01)
*H01L 21/67* (2006.01)
*H01L 21/66* (2006.01)

(52) U.S. Cl.
CPC .... *H01L 21/6836* (2013.01); *H01L 21/67132* (2013.01); *H01L 21/67253* (2013.01); *H01L 22/12* (2013.01); *H01L 21/67092* (2013.01); *H01L 2221/68336* (2013.01)

(58) Field of Classification Search
CPC ........... H01L 21/6836; H01L 21/67253; H01L 21/67092; H01L 2221/68336
See application file for complete search history.

(56) References Cited

U.S. PATENT DOCUMENTS

| 9,006,561 | B2* | 4/2015 | Komai ................ B32B 27/36 |
| | | | 136/252 |
| 2010/0147546 | A1* | 6/2010 | Mull ..................... H02G 13/00 |
| | | | 174/2 |
| 2017/0352588 | A1* | 12/2017 | Fujisawa .......... H01L 21/76862 |

FOREIGN PATENT DOCUMENTS

| JP | 2011077482 A | 4/2011 |
| JP | 2014143297 A | 8/2014 |
| WO | 03077295 A1 | 9/2003 |

* cited by examiner

*Primary Examiner* — Dung A. Le
(74) *Attorney, Agent, or Firm* — Greer, Burns & Crain, Ltd.

(57) ABSTRACT

A method of expanding a sheet includes the steps of gripping the sheet with a first gripping unit and a second griping unit and gripping the sheet with a third gripping unit and a fourth gripping unit, and expanding the sheet by moving the first gripping unit and the second griping unit away from each other in first directions relatively and moving the third gripping unit and the fourth gripping unit away from each other in second directions relatively. In the step of expanding the sheet, the states of the sheet that is under tension are detected, and movement of the first gripping unit, the second griping unit, the third gripping unit, and the fourth gripping unit is controlled based on the detected states of the sheet.

15 Claims, 5 Drawing Sheets

EXPANDING METHOD

BACKGROUND OF THE INVENTION

Field of the Invention

The present invention relates to an expanding method and an expanding apparatus for expanding a sheet.

Description of the Related Art

Workpieces such as wafers or the like have devices disposed respectively in areas demarcated by a grid of projected dicing lines on their surface. The workpieces are divided along the projected dicing lines into individual device chips that include the respective devices. According to one step for dividing a workpiece into individual device chips, a laser beam having a wavelength that is transmittable through the workpiece is applied to the workpiece, forming modified layers in the workpiece, and then the workpiece is divided into device chips in a thinning step by which the workpiece is thinned by being ground and polished (see, for example, Japanese Patent No. 3762409). The device chips thus divided from the workpiece are held closely together with no gaps therebetween, and adjacent ones of the device chips are liable to contact and cause damage to each other when the workpiece is being handled. To avoid damage of the device chips, it has been customary to stick the workpiece divided into the device chips to a sheet and then expand the sheet to create gaps between adjacent ones of the device chips.

An expanding apparatus disclosed in Japanese Patent Laid-Open No. 2011-077482, for example, is used to create gaps between device chips. When the sheet is expanded radially and outwardly, the sheet is expanded by substantially equal distances in all outward directions. If each of the device chips has different sizes lengthwise and breadthwise, then gaps that are created between the device chips when the sheet is expanded have different sizes. Therefore, even though sufficiently large gaps may be created between the device chips in one direction, e.g., lengthwise, gaps created between device chips in another direction, e.g., breadthwise, may not be sufficiently large, tending to allow adjacent device chips to contact each other when the workpiece is being handled. In view of the above problems, the present applicant has proposed an expanding apparatus for gripping four sides of the sheet and expanding the sheet (see, for example, Japanese Patent Laid-Open No. 2014-143297). The expanding apparatus includes first gripping means and second gripping means, each for gripping a sheet, disposed in facing relation to each other across a workpiece along first directions, and third gripping means and fourth gripping means, each for gripping the sheet, disposed in facing relation to each other across the workpiece along second directions perpendicular to the first directions.

SUMMARY OF THE INVENTION

In the above expanding apparatus, the workpiece is stuck to the sheet while the sheet is being gripped by the four gripping means. If the sheet is slack, however, the workpiece may not be adequately stuck to the sheet and the sheet may not be expanded sufficiently later. One solution would be to stick the workpiece to the sheet after the sheet has been slightly expanded and sufficiently kept taut. However, there are available different sheets for supporting workpieces stuck thereto, and those sheets are expanded in different manners depending on their types and their individual properties. Thus, it is tedious and time-consuming to establish distances by which the gripping means are to be moved, i.e., distances by which the sheet is to be expanded, for each of the sheets to be expanded.

It is therefore an object of the present invention to provide an expanding method and an expanding apparatus for adequately expanding a sheet without establishing distances by which the sheet is to be expanded, depending on the type and individual properties of the sheet.

In accordance with an aspect of the present invention, there is provided a method of expanding a sheet, including the steps of gripping the sheet with a first gripping unit and a second gripping unit that are disposed in facing relation to each other along first directions and with a third gripping unit and a fourth gripping unit that are disposed in facing relation to each other along second directions perpendicular to the first directions, and thereafter, expanding the sheet by moving the first gripping unit and the second gripping unit away from each other in the first directions and moving the third gripping unit and the fourth gripping unit away from each other in the second directions. The step of expanding the sheet has the steps of detecting the state of the sheet that is under tension in the first directions and the state of the sheet that is under tension in the second directions, and controlling movement of the first gripping unit, the second gripping unit, the third gripping unit, the fourth gripping unit based on the detected states.

In the aspect of the present invention, the first gripping unit and the second gripping unit may be moved away from each other in the first directions relatively by first moving mechanisms, the third gripping unit and the fourth gripping unit may be moved away from each other in the second directions relatively by second moving mechanisms, the first moving mechanisms may include first electric motors and the second moving mechanisms may include second electric motors, and the step of expanding the sheet may include the steps of detecting the state of the sheet that is under tension in the first directions with the first electric motors and detecting the state of the sheet that is under tension in the second directions with the second electric motors.

In the aspect of the present invention, the step of expanding the sheet may be carried out while a workpiece is not stuck to the sheet, and the method may further include the steps of, after the step of expanding the sheet, sticking a workpiece to the sheet, and thereafter, finally expanding the sheet by moving the first gripping unit and the second gripping unit away from each other in the first directions relatively and moving the third gripping unit and the fourth gripping unit away from each other in the second directions relatively.

In the aspect of the present invention, the step of expanding the sheet may be carried out while the workpiece is stuck to the sheet.

According to another aspect of the present invention, there is provided an apparatus for expanding a sheet, including a first gripping unit and a second gripping unit that are disposed in facing relation to each other along first directions, a third gripping unit and a fourth gripping unit that are disposed in facing relation to each other along second directions perpendicular to the first directions, first moving mechanisms for moving the first gripping unit and the second gripping unit away from each other in the first directions, second moving mechanisms for moving the third gripping unit and the fourth gripping unit away from each other in the second directions, first tension detecting units for detecting the state of the sheet that is under tension in the first directions while the sheet is gripped by the first gripping unit and the second gripping unit, second tension detecting units for detecting the state of the sheet that is under tension in the second directions while the sheet is gripped by the third gripping unit and the fourth gripping unit, and a control unit for controlling the first moving mechanisms and the second moving mechanisms based on the states of the sheet that is under tension as detected by the first tension detecting units and the second tension detecting units.

In the other aspect of the present invention, the first moving mechanisms may include respective first electric motors and the second moving mechanisms may include respective second electric motors, and the first electric motors may double respectively as the first tension detecting units, and the second electric motors may double respectively as the second tension detecting units.

A method of expanding the sheet according to the aspect of the present invention includes the steps of gripping the sheet with the first gripping unit and the second gripping unit that are disposed in facing relation to each other along the first directions and with the third gripping unit and the fourth gripping unit that are disposed in facing relation to each other along the second directions perpendicular to the first directions, and thereafter, expanding the sheet by moving the first gripping unit and the second gripping unit away from each other in the first directions relatively and moving the third gripping unit and the fourth gripping unit away from each other in the second directions relatively. The step of expanding the sheet includes the steps of detecting the state of the sheet that is under tension in the first directions and the state of the sheet that is under tension in the second directions, and controlling movement of the first gripping unit, the second gripping unit, the third gripping unit, the fourth gripping unit based on the detected states. Therefore, it is not necessary to establish, in advance, distances by which the sheet is to be expanded depending on the type and individual properties of the sheet, and the sheet can be expanded properly.

The first moving mechanisms may include the first electric motors and the second moving mechanisms may include the second electric motors, and the step of expanding the sheet may include the step of detecting the state of the sheet that is under tension in the first directions with the first electric motors and detecting the state of the sheet that is under tension in the second directions with the second electric motors. Consequently, the sheet can be expanded properly.

The step of expanding the sheet may be carried out while a workpiece is not stuck to the sheet, and the method may further include the steps of, after the step of expanding the sheet, sticking the workpiece to the sheet, and thereafter, finally expanding the sheet by moving the first gripping unit and the second gripping unit away from each other in the first directions relatively and moving the third gripping unit and the fourth gripping unit away from each other in the second directions relatively. In the step of expanding the sheet and the step of finally expanding the sheet, the sheet can be expanded properly based on the states of the sheet that is under tension.

Since the step of expanding the sheet may be carried out while a workpiece is stuck to the sheet, the sheet may be expanded properly based on the states of the sheet that is under tension to divide the workpiece into individual device chips or a surface protection tape, for example, may be peeled off from a face side of the workpiece while the sheet is being tensioned.

The apparatus for expanding the sheet according to the other aspect of the present invention includes the first gripping unit and the second gripping unit that are disposed in facing relation to each other along the first directions, the third gripping unit and the fourth gripping unit that are disposed in facing relation to each other along the second directions perpendicular to the first directions, the first moving mechanisms for moving the first gripping unit and the second gripping unit away from each other in the first directions, the second moving mechanisms for moving the third gripping unit and the fourth gripping unit away from each other in the second directions, the first tension detecting units for detecting the state of the sheet that is under tension in the first directions while the sheet is gripped by the first gripping unit and the second gripping unit, the second tension detecting units for detecting the state of the sheet that is under tension in the second directions while the sheet is gripped by the third gripping unit and the fourth gripping unit, and the control unit for controlling the first moving mechanisms and the second moving mechanisms based on the states of the sheet that is under tension as detected by the first tension detecting units and the second tension detecting units. Therefore, it is not necessary to establish, in advance, distances by which the sheet is to be expanded depending on the type and individual properties of the sheet, and the expanding apparatus can expand the sheet properly.

In the above-mentioned expanding apparatus, the first moving mechanisms may include the respective first electric motors and the second moving mechanisms may include the respective second electric motors, and the first electric motors may double respectively as the first tension detecting units, and the second electric motors may double respectively as the second tension detecting units. Since the first electric motors detect the states of the sheet that is under tension in the first directions and the second electric motors detect the states of the sheet that is under tension in the second directions, the expanding apparatus can expand the sheet properly.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENT

1. Expanding Apparatus

Figure 1:
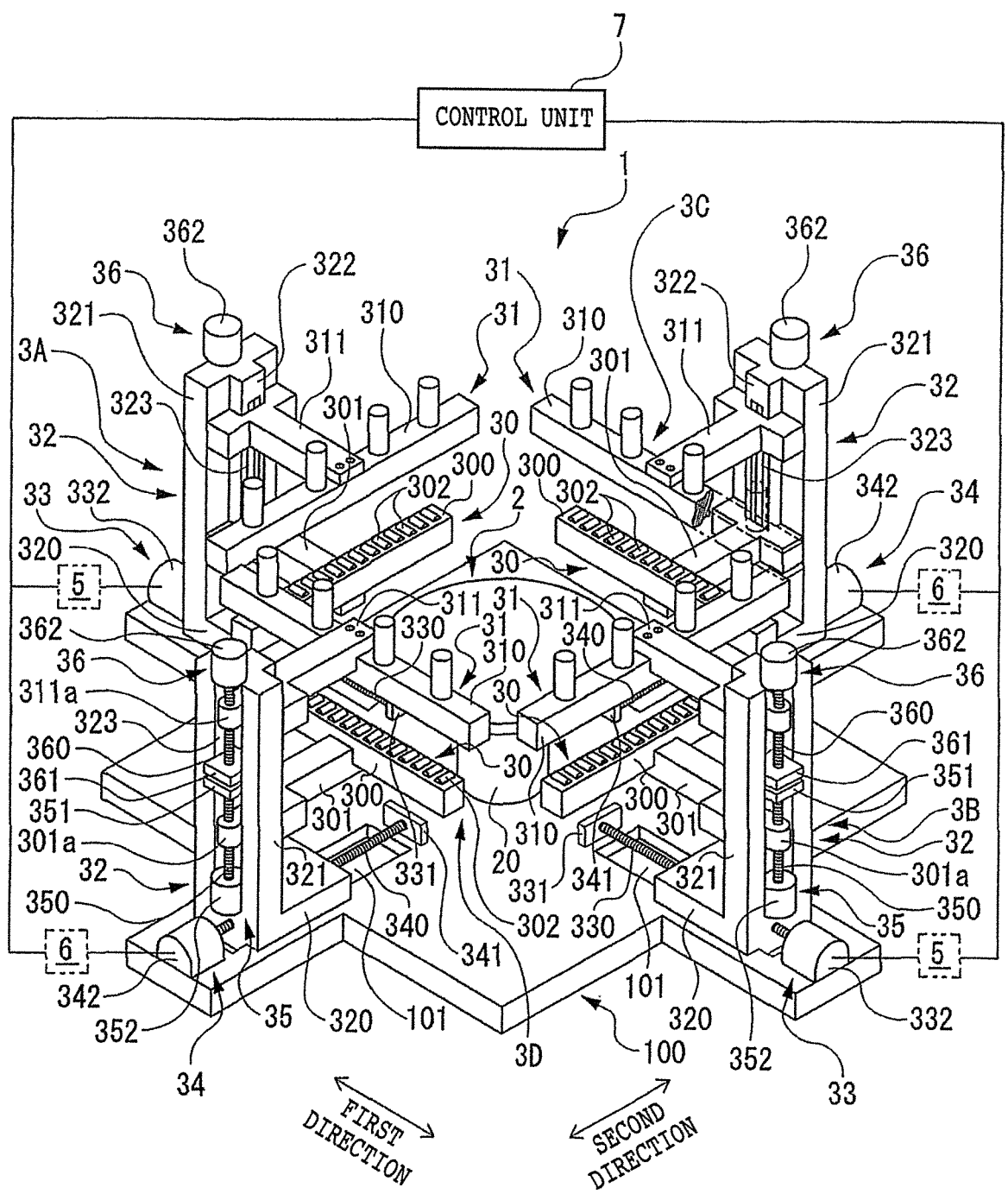
FIG. 1 is a perspective view illustrating by way of example the structure of an expanding apparatus according to the present invention.
Figure 2:
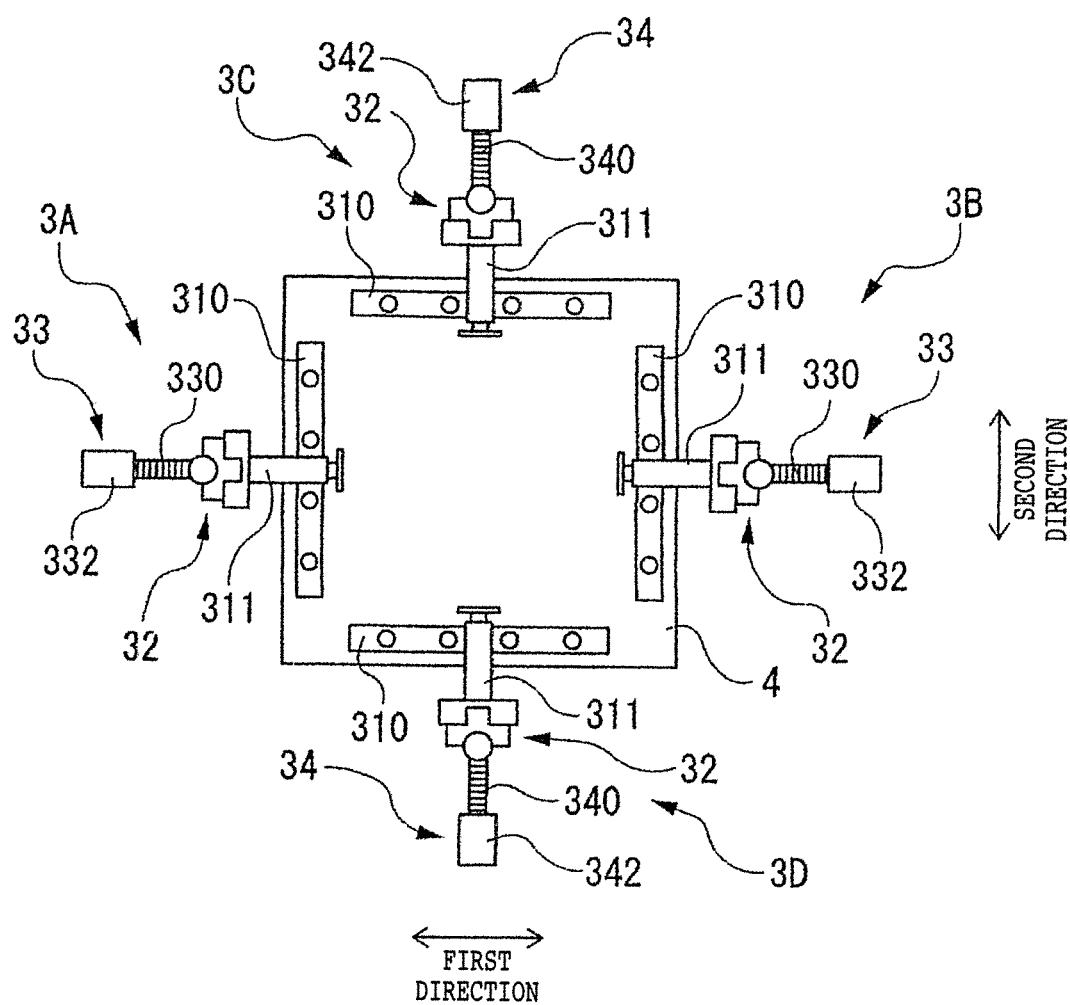
FIG. 2 is a plan view illustrating a gripping step of an expanding method carried out by the expanding apparatus illustrated in FIG. 1.

An expanding apparatus 1 illustrated in FIG. 1 represents an example of expanding apparatus capable of gripping four sides of a sheet 4 illustrated in FIG. 2 and pulling the sheet 4 outwardly in its own plane. The expanding apparatus 1 has an apparatus base 100 supporting on its upper surface a table support 20 on which a holding table 2 for holding a workpiece through the sheet 4 is supported.

The apparatus base 100 includes a first gripping unit 3A and a second gripping unit 3B, each for gripping the sheet 4, disposed in facing relation to each other along first directions, and a third gripping unit 3C and a fourth gripping unit 3D, each for gripping the sheet 4, disposed in facing relation to each other along second directions perpendicular to the first directions. Each of the first gripping unit 3A, the second gripping unit 3B, the third gripping unit 3C, and the fourth gripping unit 3D includes a lower gripping mechanism 30 for pressing a lower surface of the sheet 4, an upper gripping mechanism 31 for pressing an upper surface of the sheet 4, and a movable mount base 32 movable along a recess 101 defined in an upper surface of the apparatus base 100.

The lower gripping mechanism 30 includes a lower grip 300 in the form of a rectangular parallelepiped and an arm 301 having an end coupled to the lower grip 300. An array of rollers 302 that extends parallel to the second directions is disposed on an upper surface of the lower grip 300 of each of the first gripping unit 3A and the second gripping unit 3B. These rollers 302 are rotatable about respective axes parallel to the first directions and have substantially half outer circumferential portions projecting upwardly from the upper surface of the lower grip 300. Similarly, an array of rollers 302 that extends parallel to the first directions is disposed on an upper surface of the lower grip 300 of each of the third gripping unit 3C and the fourth gripping unit 3D. These rollers 302 are rotatable about respective axes parallel to the second directions and have substantially half outer circumferential portions projecting upwardly from the upper surface of the lower grip 300.

The upper gripping mechanism 31 includes an upper grip 310 extending parallel to the lower grip 300 and an arm 311 having an end coupled to the upper grip 310. An array of rollers, not illustrated, that extends parallel to the second directions is disposed on a lower surface of the upper grip 310 of each of the first gripping unit 3A and the second gripping unit 3B. These rollers are rotatable about respective axes parallel to the first directions and have substantially half outer circumferential portions projecting downwardly from the lower surface of the upper grip 310. Similarly, an array of rollers, not illustrated, that extends parallel to the first directions is disposed on a lower surface of the upper grip 310 of each of the third gripping unit 3C and the fourth gripping unit 3D. These rollers are rotatable about respective axes parallel to the second directions and have substantially half outer circumferential portions projecting downwardly from the lower surface of the upper grip 310.

The expanding apparatus 1 also includes a pair of first moving mechanisms (first moving means) 33 moving the first gripping unit 3A and the second gripping unit 3B toward and away from each other along the first directions, a pair of second moving mechanisms (second moving means) 34 moving the third gripping unit 3C and the fourth gripping unit 3D toward and away from each other along the second directions, a pair of first tension detecting units (first tension detecting means) 5 detecting a tension in the first directions of the sheet 4 gripped by the first gripping unit 3A and the second gripping unit 3B, a pair of second tension detecting units (second tension detecting means) 6 detecting a tension in the second directions of the sheet 4 gripped by the third gripping unit 3C and the fourth gripping unit 3D, and a control unit (control means) 7 controlling at least the first moving mechanisms 33 and the second moving mechanisms 34.

The first moving mechanisms 33 include respective ball screws 330, which are disposed on the apparatus base 100, extending along the first directions, respective bearings 331 by which respective ends of the ball screws 330 are rotatably supported, and respective first electric motors 332 coupled to respective other ends of the ball screws 330. The second moving mechanisms 34 include respective ball screws 340, which are disposed on the apparatus base 100, extending along the second directions, respective bearings 341 by which respective ends of the ball screws 340 are rotatably supported, and respective second electric motors 342 coupled to respective other ends of the ball screws 340. The first electric motors 332 and the second electric motors 342 are stepping electric motors (pulse motors), for example, though they are not limited to any specific electric motors.

Each of the movable mount bases 32, there being four movable mount bases 32 in the illustrated embodiment, is of an L-shaped cross section and includes a movable foot 320, an upstanding support 321 extending vertically from an end of the movable foot 320 and supporting the lower grip 300 and the upper grip 310, a guide rail 322 disposed on and extending along one side face of the upstanding support 321, and a guide groove 323 defined in and along the upstanding support 321 and extending horizontally from the other side face of the upstanding support 321 to the inner side face of the guide rail 322 (the one side face side of the upstanding support 321). The movable foot 320 has a nut, not illustrated, disposed therein through which the ball screw 330 or 340 is threaded. When the first electric motors 332 of the first gripping unit 3A and the second gripping unit 3B are energized, they rotate the respective ball screws 330 about their own axes, reciprocating the movable feet 320 in one of the first directions or the other. When the second electric motors 342 of the third gripping unit 3C and the fourth gripping unit 3D are energized, they rotate the respective ball screws 340 about their own axes, reciprocating the movable feet 320 in one of the second directions or the other. In the embodiment illustrated in FIG. 1, the first gripping unit 3A and the second gripping unit 3B include the respective first moving mechanisms 33. However, only one of the first gripping unit 3A and the second gripping unit 3B may include the first moving mechanism 33 for reciprocating the one of the first gripping unit 3A and the second gripping unit 3B in one of the first directions or the other. Likewise, although the third gripping unit 3C and the fourth gripping unit 3D include the respective second moving mechanisms 34 in the embodiment illustrated in FIG. 1, only one of the third gripping unit 3C and the fourth gripping unit 3D may include the second moving mechanism 34 for reciprocating the one of the third gripping unit 3C and the fourth gripping unit 3D in one of the second directions or the other.

On each of the movable mount bases 32, there are disposed a lower lifting and lowering mechanism (lower lifting and lowering means) 35 lifting and lowering the lower gripping mechanism 30 and an upper lifting and lowering mechanism (upper lifting and lowering means) 36 lifting and lowering the upper gripping mechanism 31, the lower lifting and lowering mechanism 35 and the upper lifting and lowering mechanism 36 being arranged along the guide groove 323. The lower lifting and lowering mechanism 35 includes a ball screw 350 extending vertically, a bearing 351 connected to an end of the ball screw 350, and an electric motor 352 connected to the other end of the ball screw 350. The ball screw 350 is threaded through a nut, not illustrated, disposed in a proximal end 301a of the arm 301. When the electric motor 352 is energized, it rotates the ball screw 350 about its own axis, moving the lower gripping mechanism 30 vertically, i.e., lifting and lowering the lower gripping mechanism 30.

The upper lifting and lowering mechanism 36, which is of a structure similar to the lower lifting and lowering mechanism 35, includes a ball screw 360 extending vertically, a bearing 361 connected to an end of the ball screw 360, and an electric motor 362 connected to the other end of the ball screw 360. The ball screw 360 is threaded through a nut, not illustrated, disposed in a proximal end 311a of the arm 311. When the electric motor 362 is energized, it rotates the ball screw 360 about its own axis, moving the upper gripping mechanism 31 vertically, i.e., lifting and lowering the upper gripping mechanism 31.

The first tension detecting units 5 are connected to the respective first electric motors 332 and the control unit 7. The first tension detecting units 5 include respective tension detectors, for example, and can detect a tension of the sheet 4 when it is expanded in the first directions by the first gripping unit 3A and the second gripping unit 3B. The second tension detecting units 6 are connected to the respective second electric motors 342 and the control unit 7. The second tension detecting units 6 include respective tension detectors, for example, and can detect a tension of the sheet 4 when it is expanded in the second directions by the third gripping unit 3C and the fourth gripping unit 3D.

The first tension detecting units 5 and the second tension detecting units 6 are not limited to the above configuration. The first electric motors 332 may double as the first tension detecting units 5, whereas the second electric motors 342 may double as the second tension detecting units 6. For example, the first tension detecting units 5 may include either ammeters incorporated in the first electric motors 332 for detecting the values of currents (load currents) supplied to the first electric motors 332 or torque gages incorporated in the first electric motors 332 for detecting torques of the first electric motors 332. While the first moving mechanisms 33 are in operation, the ammeters or torque gages incorporated in the first electric motors 332 detect, at all times, loads imposed on the first electric motors 332 as load current values or torque values, thereby detecting the tension of the sheet 4 in the first directions when the sheet 4 is expanded in the first directions by the first gripping unit 3A and the second gripping unit 3B.

The second tension detecting units 6 may include either ammeters incorporated in the second electric motors 342 for detecting the values of currents (load currents) supplied to the second electric motors 342 or torque gages for detecting torques of the second electric motors 342. While the second moving mechanisms 34 are in operation, the ammeters or torque gages incorporated in the second electric motors 342 detect, at all time, loads imposed on the second electric motors 342 as load current values or torque values, thereby detecting the tension of the sheet 4 in the second directions when the sheet 4 is expanded in the second directions by the third gripping unit 3C and the fourth gripping unit 3D.

The control unit 7 includes at least a central processing unit (CPU) and a storage device such as a memory or the like. The storage device stores in advance a reference value indicating the state of the sheet 4 that is under sufficient tension in the first directions and the second directions when the expanding apparatus 1 is actually operated to expand the sheet 4. The state of the sheet 4 that is under sufficient tension represents the state of the sheet 4 that is tensioned at least to the extent that the sheet 4 is not slack. Based on the state of the sheet 4 that is under tension, represented by the tensions of the sheet 4 detected by the first tension detecting units 5 and the second tension detecting units 6, the control unit 7 controls the first moving mechanisms 33 and the second moving mechanisms 34 to control movement of the first gripping unit 3A, the second gripping unit 3B, the third gripping unit 3C, and the fourth gripping unit 3D.

If the state of the sheet 4 that is under tension is to be detected by the ammeters or torque gages incorporated in the first electric motors 332 and the second electric motors 342, the storage device of the control unit 7 stores in advance a predetermined value, i.e., a predetermined load current value or torque value, indicating the state of the sheet 4 that is under sufficient tension in the first directions and the second directions when the expanding apparatus 1 is actually operated to expand the sheet 4. The control unit 7 determines whether the load current values or torque values detected by the ammeters or torque gages incorporated in the first electric motors 332 and the second electric motors 342 have reached the predetermined value or not, and then controls the first moving mechanisms 33 and the second moving mechanisms 34 to control to move the first gripping unit 3A, the second gripping unit 3B, the third gripping unit 3C, and the fourth gripping unit 3D by respective distances required to expand the sheet 4 sufficiently.

As described above, the expanding apparatus 1 according to the present invention includes the first tension detecting units 5 for detecting a tension in the first directions of the sheet 4 gripped by the first gripping unit 3A and the second gripping unit 3B, and the second tension detecting units 6 for detecting a tension in the second directions of the sheet 4 gripped by the third gripping unit 3C and the fourth gripping unit 3D. Based on the state of the sheet 4 that is under tension as detected by the first tension detecting units 5 and the second tension detecting units 6, the control unit 7 controls the first moving mechanisms 33 and the second moving mechanisms 34. Therefore, it is not necessary to establish, in advance in the expanding apparatus 1, distances by which the sheet 4 is to be expanded depending on the type and individual properties of the sheet 4, and the expanding apparatus 1 can expand the sheet 4 properly. If the first electric motors 332 double as the first tension detecting units 5, and the second electric motors 342 double as the second tension detecting units 6, then the first electric motors 332 can detect tensions of the sheet 4 in the first directions and the second electric motors 342 detect tensions of the sheet 4 in the second directions, so that the expanding apparatus 1 can expand the sheet 4 properly.

2. Expanding Method

An expanding method for expanding the sheet 4 illustrated in FIG. 2 using the expanding apparatus 1 will be described below. The expanding method has a plurality of different steps to be carried out in sequence to be described below. The sheet 4 has a size larger than the workpiece that is held on the holding table 2 through the sheet 4, and is cut to a square shape, for example. The sheet 4 may be supplied as a flat square sheet or unrolled from a sheet roll wound on a shaft not illustrated. The sheet 4 used in this embodiment is not limited to any materials and an expandable sheet made of a base layer of polyolefin, polyvinyl chloride, or the like with an adhesive layer stacked thereon may be used, for example.

(1) Gripping Step

As illustrated in FIG. 2, the first gripping unit 3A and the second gripping unit 3B that are disposed in facing relation to each other along the first directions grip opposite sides of the sheet 4, and the third gripping unit 3C and the fourth gripping unit 3D that are disposed in facing relation to each other along the second directions perpendicular to the first directions grip other opposite sides of the sheet 4. Specifically, the two first moving mechanisms 33 are actuated to move the corresponding movable mount bases 32 horizontally in the first directions to move the first gripping unit 3A and the second gripping unit 3B toward each other, and the two second moving mechanisms 34 are actuated to move the corresponding movable mount bases 32 horizontally in the second directions to move the third gripping unit 3C and the fourth gripping unit 3D toward each other. In this manner, the first gripping unit 3A, the second gripping unit 3B, the third gripping unit 3C, and the fourth gripping unit 3D are moved toward each other.

Figure 3:
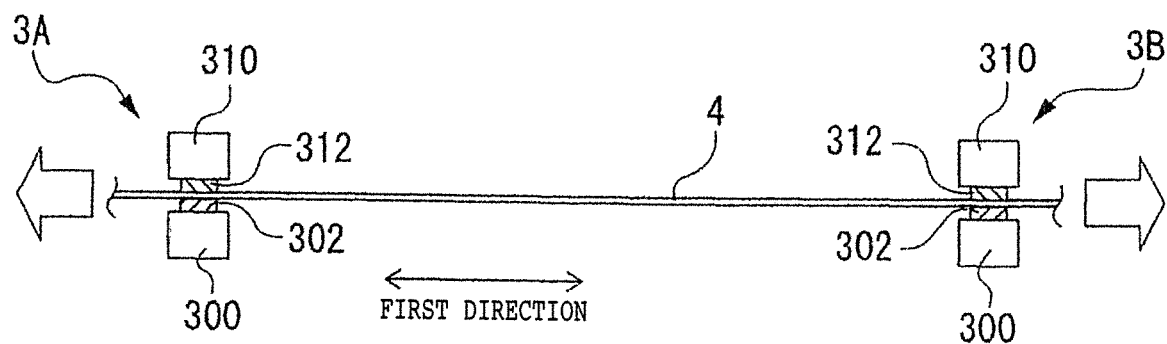
FIG. 3 is a cross-sectional view illustrating a pre-expanding step of the expanding method in first directions.

At this time, the sheet 4 is positioned between the lower grips 300 and the upper grips 310, illustrated in FIG. 1, of the first gripping unit 3A, the second gripping unit 3B, the third gripping unit 3C, and the fourth gripping unit 3D. Then, the lower lifting and lowering mechanisms 35 are actuated to lift the lower grips 300 and the upper lifting and lowering mechanisms 36 are actuated to lower the upper grips 310. As illustrated in FIG. 3, the rollers 302 on the lower grips 300 press the lower surface of the sheet 4, and the rollers 312 on the upper grips 310 press the upper surface of the sheet 4, whereupon the lower and upper surfaces of the sheet 4 are gripped by the lower grips 300 and the upper grips 310. If the sheet 4 is unrolled from a sheet roll on a shaft and pulled horizontally into the expanding apparatus 1 in one of the first directions or the second directions and has its four sides to be gripped by the first gripping unit 3A, the second gripping unit 3B, the third gripping unit 3C, and the fourth gripping unit 3D, then the first moving mechanisms 33 or the second moving mechanisms 34 may be positioned alongside of the sheet 4 horizontally pulled into the expanding apparatus 1.

(2) Expanding Step (Pre-Expanding Step)

This expanding step is carried out before the workpiece is stuck to the sheet 4. Specifically, if the sheet 4 is slack in the first directions after the gripping step and before a sticking step, to be described later, then the sheet 4 is expanded in the first directions to take up the slack, as illustrated in FIG. 3. More specifically, while the first gripping unit 3A and the second gripping unit 3B are gripping the upper and lower surfaces of the sheet 4, the first gripping unit 3A and the second gripping unit 3B are moved away from each other relatively. Namely, the two first moving mechanisms 33 illustrated in FIG. 2 are actuated to move the first gripping unit 3A and the second gripping unit 3B horizontally away from each other in the first directions, pulling the sheet 4 outwardly which is being gripped by the rollers 302 on the lower grips 300 and the rollers 312 on the upper grips 310. As a result, the sheet 4 is stretched out of the slack in the first directions.

While the sheet 4 is expanded in the first directions, the first tension detecting units 5 illustrated in FIG. 1 detect tensions of the sheet 4 in the first directions and send the detected tensions to the control unit 7. If the state of the sheet 4 that is under tension as detected by the first tension detecting units 5 is equal to or larger than the reference value stored in the storage device, then the control unit 7 determines that the sheet 4 is sufficiently expanded in the first directions. If the state of the sheet 4 that is under tension as detected by the first tension detecting units 5 is smaller than the reference value, then the control unit 7 determines that the sheet 4 is not sufficiently expanded in the first directions. In this case, the control unit 7 controls the first moving mechanisms 33 to move the first gripping unit 3A and the second gripping unit 3B horizontally away from each other in the first directions until the sheet 4 is sufficiently expanded.

If the first electric motors 332 are to detect tensions of the sheet 4 with their ammeters or torque gages, then the ammeters or torque gages detect load current values or torque values of the first electric motors 332 and send the detected load current values or torque values to the control unit 7 at all times while the first moving mechanisms 33 are in operation. If the detected load current values or torque values are equal to or larger than the predetermined value, then the control unit 7 determines that the sheet 4 is sufficiently expanded in the first directions. On the other hand, if the detected load current values or torque values are smaller than the predetermined value, then the control unit 7 determines that the sheet 4 is not sufficiently expanded in the first directions. In this case, the control unit 7 controls the first moving mechanisms 33 to move the first gripping unit 3A and the second gripping unit 3B horizontally away from each other in the first directions by respective distances required to expand the sheet 4 sufficiently in the first directions, thereby expanding the sheet 4 sufficiently in the first directions until the load current values or torque values of the first electric motors 332 reach the predetermined value.

Figure 4:
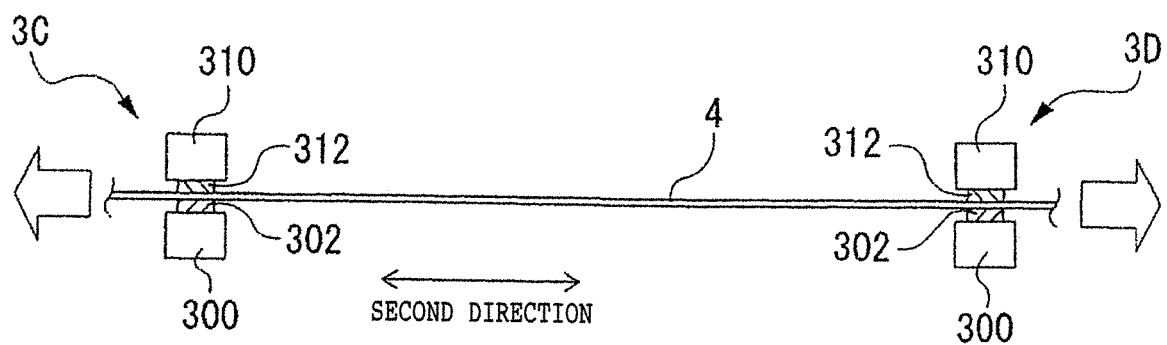
FIG. 4 is a cross-sectional view illustrating a pre-expanding step of the expanding method in second directions.

If the sheet 4 is slack in the second directions, then the sheet 4 is expanded in the second directions to take up the slack, as illustrated in FIG. 4. Specifically, while the third gripping unit 3C and the fourth gripping unit 3D are gripping the upper and lower surfaces of the sheet 4, the third gripping unit 3C and the fourth gripping unit 3D are moved away from each other relatively. Namely, the two second moving mechanisms 34 illustrated in FIG. 2 are actuated to move the third gripping unit 3C and the fourth gripping unit 3D horizontally away from each other in the second directions, pulling the sheet 4 outwardly which is being gripped by the rollers 302 on the lower grips 300 and the rollers 312 on the upper grips 310. As a result, the sheet 4 is stretched out of the slack in the second directions.

While the sheet 4 is expanded in the second directions, the second tension detecting units 6 illustrated in FIG. 1 detect tensions of the sheet 4 in the second directions and send the detected tensions to the control unit 7. If the state of the sheet 4 that is under tension as detected by the second tension detecting units 6 is equal to or larger than the reference value stored in the storage device, then the control unit 7 determines that the sheet 4 is sufficiently expanded in the second directions. If the state of the sheet 4 that is under tension as detected by the second tension detecting units 6 is smaller than the reference value, then the control unit 7 determines that the sheet 4 is not sufficiently expanded in the second directions. In this case, the control unit 7 controls the second moving mechanisms 34 to move the third gripping unit 3C and the fourth gripping unit 3D horizontally away from each other in the second directions until the sheet 4 is sufficiently expanded.

If the second electric motors 342 are to detect tensions of the sheet 4 with their ammeters or torque gages, then the ammeters or torque gages detect load current values or torque values of the second electric motors 342 and send the detected load current values or torque values to the control unit 7 at all times while the second moving mechanisms 34 are in operation. If the detected load current values or torque values are equal to or larger than the predetermined value, then the control unit 7 determines that the sheet 4 is sufficiently expanded in the second directions. On the other hand, if the detected load current values or torque values are smaller than the predetermined value, then the control unit 7 determines that the sheet 4 is not sufficiently expanded in the second directions. In this case, the control unit 7 controls the second moving mechanisms 34 to move the third gripping unit 3C and the fourth gripping unit 3D horizontally away from each other in the second directions by respective distances required to expand the sheet 4 sufficiently in the second directions, thereby expanding the sheet 4 sufficiently in the second directions until the load current values or torque values of the second electric motors 342 reach the predetermined value. When the first electric motors 332 and the second electric motors 342 detect tensions of the sheet 4 with their ammeters or torque gages, if the load current values or torque values of the first electric motors 332 and those of the second electric motors 342 become equal to each other, the control unit 7 may determine that the sheet 4 is under sufficient tension.

In the illustrated embodiment, the sheet 4 is pre-expanded in the first directions and then pre-expanded in the second directions. However, the sheet 4 may be pre-expanded simultaneously in the first and second directions, or may be pre-expanded in the second directions and then pre-expanded in the first directions. The distances by which the sheet 4 is expanded in the first directions may be equal to, or may be different from, the distances by which the sheet 4 is expanded in the second directions. The distances by which the sheet 4 is expanded in the first directions and the distances by which the sheet 4 is expanded in the second directions may be set to appropriate values depending on the state of the sheet 4 that is under tension as detected by the first tension detecting units 5 and the second tension detecting units 6.

(3) Sticking Step

Figure 5:
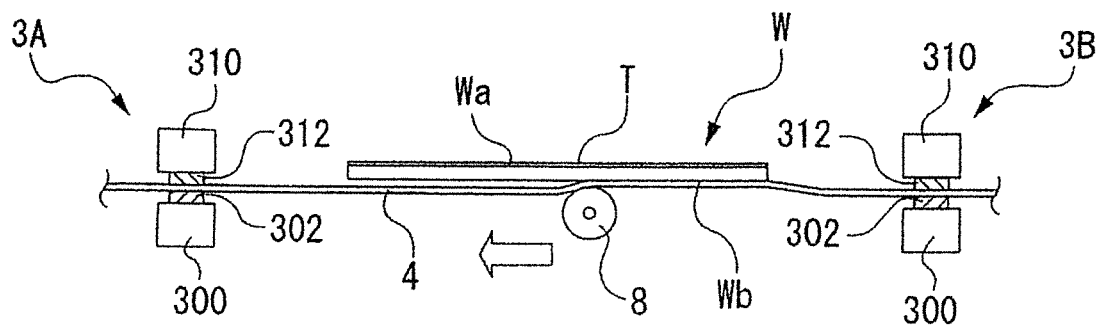
FIG. 5 is a cross-sectional view illustrating a sticking step of the expanding method.

After the above expanding step, i.e., the pre-expanding step, a reverse side (stuck side) Wb of the workpiece, denoted by W in FIG. 5, is stuck to the upper surface of the sheet 4 using a sticking roller 8, for example. The workpiece W is made of a silicon wafer, for example, having the devices disposed in respective areas that are demarcated on a face side Wa thereof by a plurality of projected dicing lines. A surface protection tape T for protecting the devices is stuck to the face side Wa of the workpiece W. It is assumed according to the illustrated embodiment that the workpiece W has modified layers formed therein along the projected dicing lines by a laser beam applied thereto, and has been thinned by a grinding apparatus, for example, and divided into individual device chips from the modified layers that serve as division initiating points. The workpiece W may have modified layers formed therein along the projected dicing lines and not divided into individual device chips. The workpiece W may alternatively have been cut by a cutting blade or the like to form cut grooves along the projected dicing lines and have been ground and divided into individual device chips, with an adhesive film referred to as "Die Attach Film (DAF)" applied to the stuck side Wb.

For sticking the workpiece W to the sheet 4, the sticking roller 8 is lifted by a lifting and lowering mechanism, not illustrated, until the sticking roller 8 contacts the lower surface of the sheet 4. Then, the sticking roller 8 presses the lower surface of the sheet 4 upwardly while it is rotating, and is caused to roll horizontally as indicated the outline arrow in FIG. 5. By being pressed by the rolling sticking roller 8, the sheet 4 is pressed against the stuck side Wb of the workpiece W and stuck to the stuck side Wb in its entirety. Thereafter, the sticking roller 8 is lowered and retracted away from the sheet 4. At this time, the upper and lower surfaces of the sheet 4 are being gripped by the first gripping unit 3A, the second gripping unit 3B, the third gripping unit 3C, and the fourth gripping unit 3D illustrated in FIG. 2, and will be gripped until the severance of the sheet 4 is completed as described later.

(4) Expanding Step (Preliminary Expanding Step)

Figure 6:
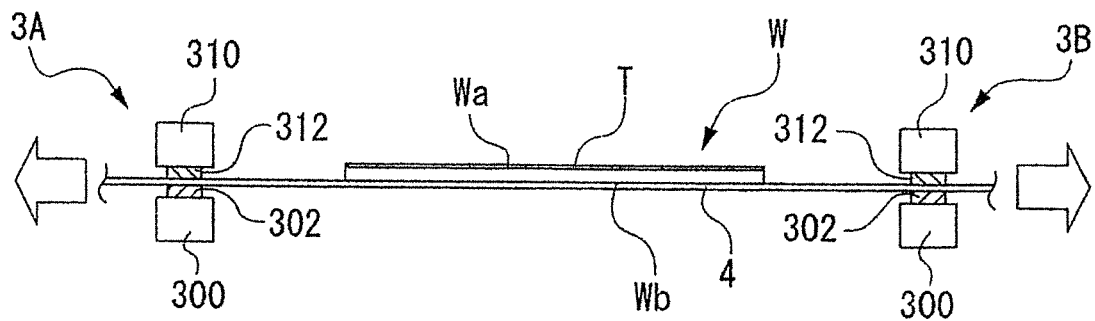
FIG. 6 is a cross-sectional view illustrating a preliminary expanding step of the expanding method.

This expanding step is carried out on the sheet 4 with the workpiece W stuck thereto, as illustrated in FIG. 6. Specifically, the two first moving mechanisms 33 are actuated to move the first gripping unit 3A and the second gripping unit 3B horizontally away from each other in the first directions, pulling the sheet 4 outwardly in the first directions. The two second moving mechanisms 34 are actuated to move the third gripping unit 3C and the fourth gripping unit 3D horizontally away from each other in the second directions, pulling the sheet 4 outwardly in the second directions. The expansion of the sheet 4 in this expanding step is referred to as preliminary expansion. Since the sheet 4 is tensioned by the preliminary expansion in the first and second directions, the sheet 4 is firmly stuck to the stuck side Wb of the workpiece W, preventing the device chips from interfering with each other when the surface protection tape T is subsequently peeled off from the face side Wa of the workpiece W.

During the preliminary expansion of the sheet 4, the first tension detecting units 5 and the second tension detecting units 6 may detect the state of the sheet 4 that is under tension and send the detected state to the control unit 7, or the first electric motors 332 and the second electric motors 342 may detect the state of the sheet 4 that is under tension and send the detected state to the control unit 7. Based on the detected state, the control unit 7 controls the first moving mechanisms 33 and the second moving mechanisms 34 to move the first gripping unit 3A, the second gripping unit 3B, the third gripping unit 3C, and the fourth gripping unit 3D away from each other in the first and second directions relatively by respective distances required to expand the sheet 4 sufficiently in the first and second directions. If the workpiece W has not been divided into individual device chips thus far, then the workpiece W may be divided into individual device chips by the preliminary expansion. Since the sheet 4 has been pre-expanded, adjacent ones of the individual device chips thus produced do not tend to contact each other. If an adhesive film has been applied to the stuck side Wb of the workpiece W, external forces are applied to the adhesive film during the preliminary expansion of the sheet 4, breaking the adhesive film along the projected dicing lines.

(5) Surface Protection Tape Peeling Step

Figure 7:
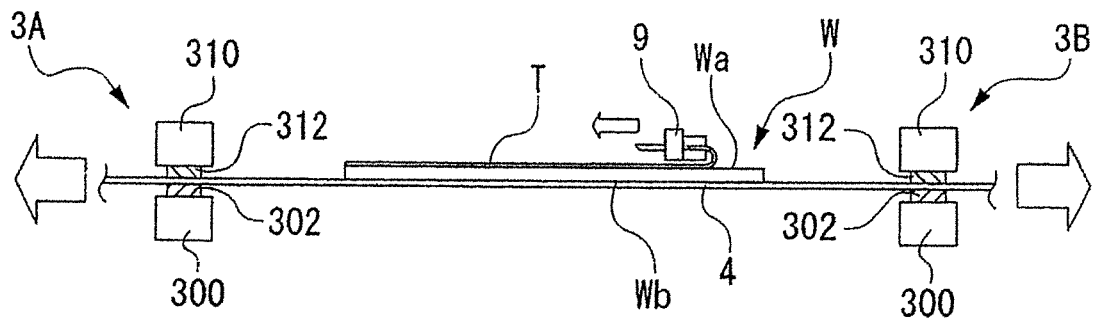
FIG. 7 is a cross-sectional view illustrating a surface protection tape peeling step of the expanding method.

During the preliminary expanding step, while the sheet 4 is being expanded, the surface protection tape T is peeled off from the face side Wa of the workpiece W using a peeling mechanism (peeling means) 9, as illustrated in FIG. 7. Specifically, the peeling mechanism 9 grips an outer peripheral portion of the surface protection tape T and moves from a right end illustrated in FIG. 7 of the workpiece W toward the other left end thereof, thereby fully peeling off the surface protection tape T from the face side Wa of the workpiece W.

(6) Final Expanding Step

Figure 8:
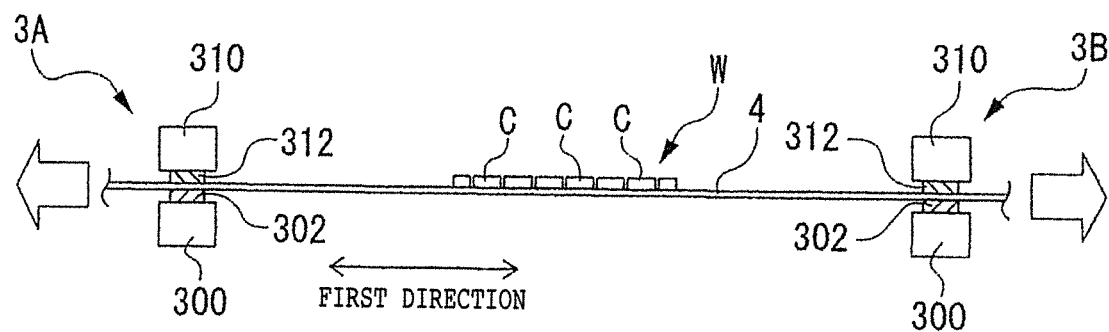
FIG. 8 is a cross-sectional view illustrating a final expanding step of the expanding method in the first directions.

Next, the first gripping unit 3A and the second gripping unit 3B are moved away from each other in the first directions relatively, and the third gripping unit 3C and the fourth gripping unit 3D are moved away from each other in the second directions relatively, expanding the sheet 4 to create gaps between the individual device chips, denoted by C in FIG. 8. Specifically, the two first moving mechanisms 33 illustrated in FIG. 2 are actuated to move the first gripping unit 3A and the second gripping unit 3B horizontally away from each other in the first directions, pulling the sheet 4 outwardly to expand the sheet 4 by distances larger than the distances by which the sheet 4 has been expanded in the preliminary expanding step, as illustrated in FIG. 8. As the sheet 4 is further expanded in the final expanding step, the gaps between the device chips C are increased to sufficient sizes in the first directions, thereby preventing adjacent ones of the device chips C from contacting each other when the workpiece W is delivered.

Figure 9:
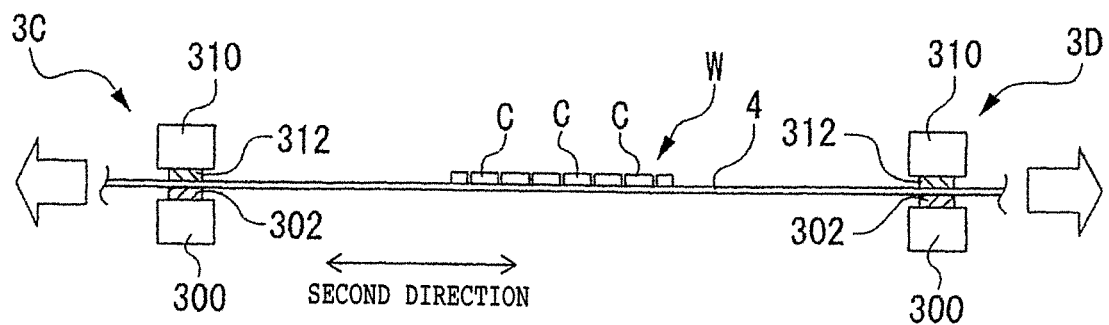
FIG. 9 is a cross-sectional view illustrating a final expanding step of the expanding method in the second directions.

Then, the two first moving mechanisms 34 illustrated in FIG. 2 are actuated to move the third gripping unit 3C and the fourth gripping unit 3D horizontally away from each other in the second directions, pulling the sheet 4 outwardly to expand the sheet 4 by distances larger than the distances by which the sheet 4 has been expanded in the preliminary expanding step, as illustrated in FIG. 9. As the sheet 4 is further expanded in the final expanding step, the gaps between the device chips C are increased to sufficient sizes in the second directions, thereby preventing adjacent ones of the device chips C from contacting each other when the workpiece W is delivered, as the final expanding in the first directions. If the workpiece W has been divided into individual chips C and the DAF has been stuck to the stuck side Wb of the workpiece W or if the workpiece W has not been divided into individual device chips C along the modified layers, then the DAF or the workpiece W is divided in the final expanding step. In the final expanding step, the sheet 4 with the workpiece W stuck thereof may be expanded by a mounter, which is an apparatus different from the expanding apparatus 1.

During the final expanding step, the first tension detecting units 5 and the second tension detecting units 6 may detect the state of the sheet 4 that is under tension and send the detected state to the control unit 7, or the first electric motors 332 and the second electric motors 342 may detect the state of the sheet 4 that is under tension and send the detected state to the control unit 7. Based on the detected state, the control unit 7 controls the first moving mechanisms 33 and the second moving mechanisms 34 to move the first gripping unit 3A, the second gripping unit 3B, the third gripping unit 3C, and the fourth gripping unit 3D horizontally away from each other in the first and second directions by respective distances required to expand the sheet 4 sufficiently in the first and second directions, as the preliminary expanding step above-mentioned.

In the illustrated embodiment, the sheet 4 is finally expanded in the first directions and then finally expanded in the second directions. However, the sheet 4 may be finally expanded simultaneously in the first and second directions, or may be finally expanded in the second directions and then finally expanded in the first directions. The distances by which the sheet 4 is finally expanded in the first directions may be equal to, or may be different from, the distances by which the sheet 4 is finally expanded in the second directions.

If the workpiece W thus expanded in the final expanding step includes an undivided area that has not been divided into individual device chips C, i.e., an area that has not been divided from the modified layers that serve as division initiating points, then external forces are applied to the workpiece W by a squeegee, for example, dividing the workpiece W into individual device chips C. Thereafter, an annular frame with a central opening defined therein is stuck to the sheet 4, exposing the workpiece W through the central opening, and the sheet 4 is cut along the frame, producing a frame unit in which the frame and the workpiece W are integrally combined with each other by the sheet 4. Then, the frame unit is delivered to a next step, e.g., a packaging step.

As described above, the expanding method according to the present invention includes the gripping step for gripping the sheet 4 with the first gripping unit 3A and the second gripping unit 3B that are disposed in facing relation to each other along the first directions and with the third gripping unit 3C and the fourth gripping unit 3D that are disposed in facing relation to each other along the second directions perpendicular to the first directions, and the expanding step for moving the first gripping unit 3A and the second gripping unit 3B away from each other in the first directions and moving the third gripping unit 3C and the fourth gripping unit 3D away from each other in the second directions. In the expanding step, the first tension detecting units 5 and the second tension detecting units 6 detect the state of the sheet 4 that is under tension, or the first electric motors 332 and the second electric motors 342 detect the state of the sheet 4 that is under tension, and the control unit 7 controls movement of the first gripping unit 3A, the second gripping unit 3B, the third gripping unit 3C, and the fourth gripping unit 3D based on the detected state of the sheet 4 that is under tension. Therefore, it is not necessary to establish, in advance, distances by which the sheet 4 is to be expanded depending on the type and individual properties of the sheet 4, and the sheet 4 can be expanded properly.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of expanding a sheet, comprising the steps of:
    gripping the sheet with a first gripping unit and a second gripping unit that are disposed in facing relation to each other along first directions and with a third gripping unit and a fourth gripping unit that are disposed in facing relation to each other along second directions perpendicular to the first directions; and
    thereafter, expanding the sheet by moving the first gripping unit and the second gripping unit away from each other in the first directions and moving the third gripping unit and the fourth gripping unit away from each other in the second directions; wherein
    the step of expanding the sheet includes the steps of detecting the state of the sheet that is under tension in the first directions and the state of the sheet that is under tension in the second directions, wherein the steps of detecting the state of the sheet comprise detecting tensions in the sheet in the first directions and in the second directions; and
    controlling movement of the first gripping unit, the second gripping unit, the third gripping unit, the fourth gripping unit based on the detected tensions.

2. The method according to claim 1, wherein the first gripping unit and the second gripping unit are moved away from each other in the first directions relatively by first moving mechanisms;

the third gripping unit and the fourth gripping unit are moved away from each other in the second directions relatively by second moving mechanisms;

the first moving mechanisms include first electric motors and the second moving mechanisms include second electric motors; and the step of expanding the sheet includes the steps of:

detecting the state of the sheet that is under tension in the first directions with the first electric motors and detecting the state of the sheet that is under tension in the second directions with the second electric motors.

3. The method according to claim 1, wherein the step of expanding the sheet is carried out while a workpiece is not stuck to the sheet, the method further comprises the steps of:

after the step of expanding the sheet, sticking a workpiece to the sheet; and thereafter, finally expanding the sheet by moving the first gripping unit and the second gripping unit away from each other in the first directions relatively and moving the third gripping unit and the fourth gripping unit away from each other in the second directions relatively.

4. The method according to claim 1, wherein the step of expanding the sheet is carried out while a workpiece is stuck to the sheet.

5. The method according to claim 1, wherein the step of expanding the sheet is carried out while a workpiece is not stuck to the sheet; and wherein steps of detecting the state of the sheet that is under tension in the first directions and the state of the sheet that is under tension in the second directions is performed using tension detectors.

6. The method according to claim 5, wherein steps of detecting the state of the sheet that is under tension in the first directions and the state of the sheet that is under tension in the second directions is performed using the tension detectors communicatively coupled to a controller.

7. The method according to claim 2, wherein the step of expanding the sheet is carried out while a workpiece is not stuck to the sheet; and wherein steps of detecting the state of the sheet that is under tension in the first directions with the first electric motors and detecting the state of the sheet that is under tension in the second directions with the second electric motors is performed using tension detectors.

8. The method according to claim 7, wherein steps of detecting the state of the sheet that is under tension in the first directions and the state of the sheet that is under tension in the second directions is performed using the tension detectors communicatively coupled to a controller.

9. The method according to claim 2, wherein the step of expanding the sheet is carried out while a workpiece is not stuck to the sheet; and wherein the first electric motors and the second electric motors double as tension detectors.

10. The method according to claim 9, wherein the first electric motors and the second electric motors are communicatively coupled to a controller and the controller controls the operation of the motors.

11. The method according to claim 10, wherein the controller has a memory associated therewith and wherein memory has at least one predetermined tension value stored therein, and wherein the controller instructs one or more of the electric motors to cause the first moving mechanisms to move the first gripping unit and the second gripping unit to move away from each other if a first tension value detected by a first one of the tension detectors is less than the at least one stored predetermined tension value.

12. The method according to claim 11, wherein the controller does not instruct one or more of the electric motors to cause the first moving mechanisms to move the first gripping unit and the second gripping unit to move away from each other if the first tension value detected by the first one of the tension detectors is greater than the at least one stored predetermined tension value.

13. The method according to claim 11, wherein the controller instructs one or more of the electric motors to cause the second moving mechanisms to move the third gripping unit and the fourth gripping unit to move away from each other if a second tension value detected by a second one of the tension detectors is less than the at least one stored predetermined tension value.

14. A method of expanding a sheet, comprising the steps of:

gripping a sheet with a first gripping unit and a second gripping unit that are disposed in facing relation to each other along first directions and with a third gripping unit and a fourth gripping unit that are disposed in facing relation to each other along second directions perpendicular to the first directions, wherein during the gripping step the sheet does not have a workpiece stuck thereto; and thereafter, expanding the sheet by moving the first gripping unit and the second gripping unit away from each other in the first directions and moving the third gripping unit and the fourth gripping unit away from each other in the second directions, wherein during the expanding step the sheet does not have a workpiece stuck thereto; wherein the step of expanding the sheet includes the steps of detecting the state of the sheet that is under tension in the first directions and the state of the sheet that is under tension in the second directions, wherein the steps of detecting the state of the sheet comprise detecting tensions in the sheet in the first directions and in the second directions; and controlling movement of the first gripping unit, the second gripping unit, the third gripping unit, the fourth gripping unit based on the detected tensions.

15. The method according to claim 14, further comprising the steps of:

after the step of expanding the sheet, sticking a workpiece to the sheet; and thereafter, finally expanding the sheet by moving the first gripping unit and the second gripping unit away from each other in the first directions relatively and moving the third gripping unit and the fourth gripping unit away from each other in the second directions relatively.

* * * * *